(12) United States Patent
Yang et al.

(10) Patent No.: US 12,550,543 B2
(45) Date of Patent: Feb. 10, 2026

(54) DISPLAY SUBSTRATE AND MANUFACTURING METHOD THEREOF AND DISPLAY PANEL

(71) Applicants: Chengdu BOE Optoelectronics Technology Co., Ltd., Sichuan (CN); BOE TECHNOLOGY GROUP CO., LTD., Beijing (CN)

(72) Inventors: Huijuan Yang, Beijing (CN); Yang Zhou, Beijing (CN); Tingliang Liu, Beijing (CN); Tinghua Shang, Beijing (CN); Yu Wang, Beijing (CN); Maoying Liao, Beijing (CN)

(73) Assignees: Chengdu BOE Optoelectronics Technology Co., Ltd., Sichuan (CN); Beijing BOE Technology Development Co., Ltd., Beijing (CN)

(*) Notice: Subject to any disclaimer, the term of this patent is extended or adjusted under 35 U.S.C. 154(b) by 668 days.

(21) Appl. No.: 17/908,395

(22) PCT Filed: Oct. 22, 2021

(86) PCT No.: PCT/CN2021/125538
§ 371 (c)(1),
(2) Date: Aug. 31, 2022

(87) PCT Pub. No.: WO2022/179139
PCT Pub. Date: Sep. 1, 2022

(65) Prior Publication Data
US 2024/0196669 A1    Jun. 13, 2024

(30) Foreign Application Priority Data
Feb. 26, 2021 (CN) .......................... 202110219776.2

(51) Int. Cl.
H10K 59/126 (2023.01)
H10K 59/131 (2023.01)
H10K 59/80 (2023.01)

(52) U.S. Cl.
CPC ......... H10K 59/126 (2023.02); H10K 59/131 (2023.02); H10K 59/873 (2023.02); H10K 59/8794 (2023.02)

(58) Field of Classification Search
CPC .................................................. H10K 59/126
See application file for complete search history.

(56) References Cited

U.S. PATENT DOCUMENTS

2016/0254338 A1* 9/2016 Lin ..................... H10D 30/6745
257/40
2017/0062542 A1* 3/2017 Jung ..................... H10K 59/805
(Continued)

FOREIGN PATENT DOCUMENTS

CN    107958922 A    4/2018
CN    211150599 U    7/2020
(Continued)

*Primary Examiner* — Chad M Dicke
*Assistant Examiner* — Prashant Kenkare
(74) *Attorney, Agent, or Firm* — HOUTTEMAN LAW LLC (57) ABSTRACT

The display substrate of the present disclosure includes: a substrate having a display side and a back side opposite to each other; a display structure on the display side of the substrate, the display structure including a positive voltage interface for supplying a positive voltage and a plurality of pixel circuits, each pixel circuit including a plurality of transistors; a shielding structure between the substrate and the display structure, the shielding structure being made of a conductive material and electrically coupled to the positive voltage interface; wherein an orthographic projection of active regions of at least a portion of the transistors on the substrate coincides with an orthographic projection of the (Continued)

shielding structure on the substrate; and an insulating isolation layer between the shielding structure and the display structure.

16 Claims, 6 Drawing Sheets

(56) References Cited

U.S. PATENT DOCUMENTS

| | | | | |
|---|---|---|---|---|
| 2017/0117343 A1* | 4/2017 | Oh | ..................... | H10K 59/1213 |
| 2017/0317156 A1* | 11/2017 | Kim | ..................... | H10K 59/126 |
| 2018/0175077 A1* | 6/2018 | Koo | ..................... | H10K 59/126 |
| 2018/0301517 A1 | 10/2018 | Kokame | | |
| 2019/0181155 A1 | 6/2019 | Li et al. | | |
| 2019/0197965 A1* | 6/2019 | Park | ..................... | G09G 3/3266 |
| 2019/0205595 A1* | 7/2019 | Gong | ..................... | B06B 1/0692 |
| 2022/0310740 A1* | 9/2022 | Tang | ................. | H10D 30/6723 |

FOREIGN PATENT DOCUMENTS

| | | |
|---|---|---|
| CN | 112331714 A | 2/2021 |
| CN | 112951891 A | 6/2021 |

* cited by examiner

DISPLAY SUBSTRATE AND
MANUFACTURING METHOD THEREOF
AND DISPLAY PANEL

CROSS-REFERENCE TO RELATED
APPLICATION

This is a National Phase Application filed under 35 U.S.C. 371 as a national stage of PCT/CN2021/125538, filed on Oct. 22, 2021.

TECHNICAL FIELD

The present disclosure relates to the technical field of a display substrate, in particular to a display substrate, a manufacturing method thereof and a display panel.

BACKGROUND

A display panel may include a display substrate and a cover glass (CG)/cover plate made of glass, and a metal heat dissipation layer (SCF) may be further disposed on a side of the display substrate away from the cover glass.

Figure 1:
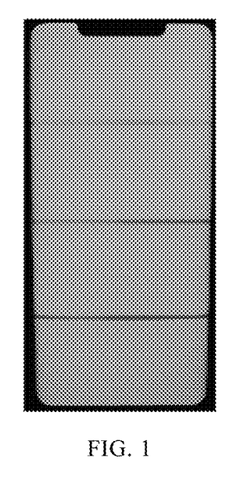
FIG. 1 is a photograph of four-split screen phenomenon.

In practice, it is found that when the display panel is subjected to more friction, a poor display may occur, for example, four-split screen phenomenon may occur as shown in FIG. 1.

SUMMARY

The present disclosure provides a display substrate, a manufacturing method thereof and a display panel.

In a first aspect, an embodiment of the present disclosure provides a display substrate, including: a substrate having a display side and a back side opposite to each other; a display structure on the display side of the substrate, the display structure including a positive voltage interface configured to supply a positive voltage and a plurality of pixel circuits, each pixel circuit including a plurality of transistors; a shielding structure between the substrate and the display structure, the shielding structure being made of a conductive material and electrically coupled to the positive voltage interface, wherein an orthographic projection of active regions of at least a portion of the transistors on the substrate coincides with an orthographic projection of the shielding structure on the substrate; and an insulating isolation layer between the shielding structure and the display structure.

In some embodiments, the orthographic projection of the active region of each transistor on the substrate coincides with the orthographic projection of the shielding structure on the substrate.

In some embodiments, the shielding structure includes a plurality of connection portions, and a plurality of shielding portions: each shielding portion corresponds to an active region of a respective one of the transistors, and the orthographic projection of the active region of the transistor on the substrate coincides with the orthographic projection of shielding portion corresponding thereto on the substrate; and each shield portion is electrically coupled to the positive voltage interface through the connection portion.

In some embodiments, the display structure further includes: a plurality of positive voltage signal lines extending in a first direction, each positive voltage signal line coupling a plurality of pixel circuits arranged in a line in the first direction and being electrically coupled to the positive voltage interface; and each shield portion is electrically coupled to the positive voltage signal line through the connection portion.

In some embodiments, the plurality of connection portions include a plurality of first connection portions, and a plurality of second connection portions extending in the first direction: the shield portions corresponding to the transistors in the plurality of pixel circuits arranged in a line in the first direction are coupled to a same second connection portion through the first connection portions, respectively; and at one end of the display substrate in the first direction, each of the second connection portions is coupled to a respective one of the plurality of positive voltage signal lines through a via in the insulating isolation layer.

In some embodiments, the connection portion further includes a plurality of third connection portions; and in at least a portion of adjacent pixel circuits arranged in a direction perpendicular to the first direction, at least some shield portions corresponding to the transistors in different pixel circuits are coupled to each other through the third connection portion.

In some embodiments, the connection portion further includes a fourth connection portion; and the shield portions corresponding to the plurality of transistors of each pixel circuit are coupled to the fourth connection portion, which is coupled to the positive voltage signal line in the pixel circuit through a via in the insulating isolation layer.

In some embodiments, the display structure further includes: a gate insulating layer on a side of the active region of each transistor away from the substrate; and a first gate layer on a side of the gate insulating layer away from the substrate, wherein a gate electrode of the transistor is in the first gate layer.

In some embodiments, the transistor is a P-type transistor.

In some embodiments, the display structure further includes: a first interlayer insulating layer on a side of the first gate layer away from the substrate; a second gate layer on a side of the first interlayer insulating layer away from the substrate; a second interlayer insulating layer on a side of the second gate layer away from the substrate; a source-drain layer on a side of the second interlayer insulating layer away from the substrate; a planarization layer on a side of the source-drain layer away from the substrate; and a light emitting device on a side of the planarization layer away from the substrate.

In some embodiments, each pixel circuit includes: a storage capacitor having a first electrode coupled to a positive voltage signal terminal, which is electrically coupled to the positive voltage interface; a first transistor having a gate electrode coupled to a reset signal terminal, a first electrode coupled to a second electrode of the storage capacitor, and a second electrode coupled to an initialization signal terminal;

a second transistor having a gate electrode coupled to a gate signal terminal and a first electrode coupled to the second electrode of the storage capacitor; a third transistor having a gate electrode coupled to the second electrode of the storage capacitor and a second electrode coupled to a second electrode of the second transistor; a fourth transistor having a gate electrode coupled to the gate signal terminal, a first electrode coupled to a first electrode of the third transistor, and a second electrode coupled to a data signal terminal; a fifth transistor having a gate electrode coupled to a control signal terminal, a first electrode coupled to the positive voltage signal terminal, and a second electrode coupled to a first electrode of the third transistor; a sixth transistor having a gate electrode coupled to the control signal terminal and a first electrode coupled to the second electrode of the second transistor; a seventh transistor having a gate electrode coupled to the gate signal terminal, a first electrode coupled to a second electrode of the sixth transistor, and a second electrode coupled to the initialization signal terminal; and a light emitting device having a first electrode coupled to the second electrode of the sixth transistor, and a second electrode coupled to a negative voltage signal terminal.

In some embodiments, orthographic projections of at least the active region of the second transistor and the active region of the fourth transistor on the substrate coincide with the orthographic projection of the shielding structure on the substrate.

In a second aspect, an embodiment of the present disclosure provides a display panel, including: the display substrate in any one of the above embodiments; a cover glass on the display side of the substrate of the display substrate; and a metal heat dissipation layer on the back side of the substrate of the display substrate.

In a third aspect, an embodiment of the present disclosure provides a method for manufacturing a display substrate, where the display substrate is the display substrate in any one of the above embodiments, and the method includes: sequentially forming the shielding structure, the insulating isolation layer and the display structure on the display side of the substrate.

BRIEF DESCRIPTION OF DRAWINGS

The accompanying drawings, which are provided for further understanding of embodiments of the present disclosure and constitute a part of this specification, are for explaining the present disclosure together with the embodiments of the present disclosure, but are not intended to limit the present disclosure. The above and other features and advantages will become more apparent to ordinary skill in the art by describing in detail exemplary embodiments thereof with reference to the drawings. In the drawings.

Meanings of reference numbers in the embodiments of the present disclosure are: 1. a shielding structure; 11. a shielding portion; 121. a first connection portion; 122. a second connection portion; 123. a third connection portion; 2. an active region; 5. a gate electrode; 31. a positive voltage signal line; 39. a data signal line; 91. a substrate; 92. a metal heat dissipation layer; 93. an isolation layer; 94. a gate insulating layer; 99. a cover glass; T1, a first transistor; T2, a second transistor; T3, a third transistor; T4, a fourth transistor; T5, a fifth transistor; T6, a sixth transistor; T7, a seventh transistor; OLED, a light emitting device; Cst, a storage capacitor; VDD, a positive voltage signal terminal; VSS, a negative voltage signal terminal; Reset, a reset signal terminal; Gate, a gate signal terminal; Data, a data signal terminal; EM, a control signal terminal; Vinit, an initialization signal terminal; N1, a first node.

DETAIL DESCRIPTION OF EMBODIMENTS

In order to enable one of ordinary skill in the art to better understand the technical solutions of the embodiments of the present disclosure, a display substrate, a manufacturing method thereof and a display panel will be described in further detail with reference to the accompanying drawings.

The present disclosure will be described more fully hereinafter with reference to the accompanying drawings, but the embodiments shown may be embodied in different forms and should not be construed as limited to the embodiments set forth herein. Rather, these embodiments are provided so that the present disclosure will be thorough and complete, and will fully convey the scope of the present disclosure to one ordinary skill in the art.

The present disclosure may be described with reference to plan views and/or cross-sectional views by way of idealized schematic diagrams of the present disclosure. Accordingly, the example illustrations may be modified in accordance with manufacturing techniques and/or tolerances.

Embodiments of the present disclosure and features of the embodiments may be combined with each other in case of no conflict.

The terms used herein are for the purpose of describing particular embodiments only and are not intended to limit the present disclosure. As used herein, a term "and/or" includes any and all combinations of one or more of the associated listed items. As used herein, the singular forms "a", "an" and "the" are intended to include a plural form as well, unless the context clearly indicates otherwise. As used herein, a term "including", "made of", specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It should be further understood that terms, such as those defined in commonly used dictionaries, should be interpreted as having a meaning that is consistent with their meaning in the context of the relevant art and the present disclosure, and should not be interpreted in an idealized or overly formal sense unless expressly so defined herein.

The disclosed embodiments are not limited to the embodiments shown in the drawings, but include modifications of configurations formed based on a manufacturing process. Thus, regions illustrated in the drawings have schematic properties, and shapes of the regions shown in the drawings illustrate specific shapes of the regions of elements, but are not intended to be limiting.

In the embodiments of the present disclosure, a plurality of structures are "provided in a same layer", which means that the plurality of structures are formed of the same material layer, so that the plurality of structures are in the same layer in the stacking relationship, but does not mean that the plurality of structures have a same distance from the substrate, nor that other layers between the plurality of structures and the substrate are equal to each other; and thus, a positional relationship between the structures and the substrate also refers to the stacking relationship of layers in which the structures are located, and not to an absolute position or distance with respect to the substrate.

In the embodiment of the present disclosure, a "patterning process" refers to a step of forming a structure having a specific pattern, may be a photolithography process. The photolithography process includes one or more steps of forming a material layer, coating a photoresist, exposing, developing, etching, and stripping the photoresist. Alternatively, the patterning process may be an imprinting process, an inkjet printing process, or other processes.

In the related art, a pixel circuit including a light emitting device for emitting light to display may be provided in a display substrate.

A display panel includes the display substrate, and in order to protect the display substrate, the display panel further includes a cover glass (CG) arranged on a display side of the display substrate, and the cover glass may be made of glass or the like: in order to enhance the heat dissipation, a metal heat dissipation layer (SCF) may be disposed (e.g., attached, adhered) on a back side of the display substrate.

A copper rod friction test is used for simulating a condition at which the display panel is subjected to friction, so as to test the performance of the display panel. When the copper rod friction test is performed on the display panel with the structure, it is found that a poor display may easily occur in the display panel (such as the four-split screen phenomenon).

The reasons for the poor display may be: when the display panel is subjected to the friction, the cover glass generates a negative voltage (such as, −500V) due to electrostatic accumulation, and the metal heat dissipation layer generates a positive voltage (such as, 200V) due to the electrostatic accumulation, so that an external electric field ($E_{external}$) pointing to the cover glass from the metal heat dissipation layer is generated in the display panel; a direction of the external electric field is the same as or opposite to an original driving electric field ($E_{internal}$) used to turn on transistors in a pixel circuit, thereby causing drift of characteristics of the transistors in the pixel circuit, and turning on the transistors more easily or more hardly than in a normal state, which affects the display quality.

For example, when the pixel circuit is located on the display side of the display substrate, and the transistor therein is a top-gate P-type transistor (such as a polysilicon transistor), a gate electrode of the transistor is located on a side of the active region away from the substrate, and the transistor is turned on when a low voltage is applied thereto, so that in the active region, the original driving electric field ($E_{internal}$) points to the gate electrode from the substrate, that is, the driving electric field has the same direction as the external electric field, which means that the driving electric field "strengthens" the original driving electric field, or "weakens" the electric field for turning off the transistor, so that a threshold voltage (Vth) of the transistor decreases, and thus, the undesired turning-on of the transistor is more likely to occur, which affects the display.

Figure 4:
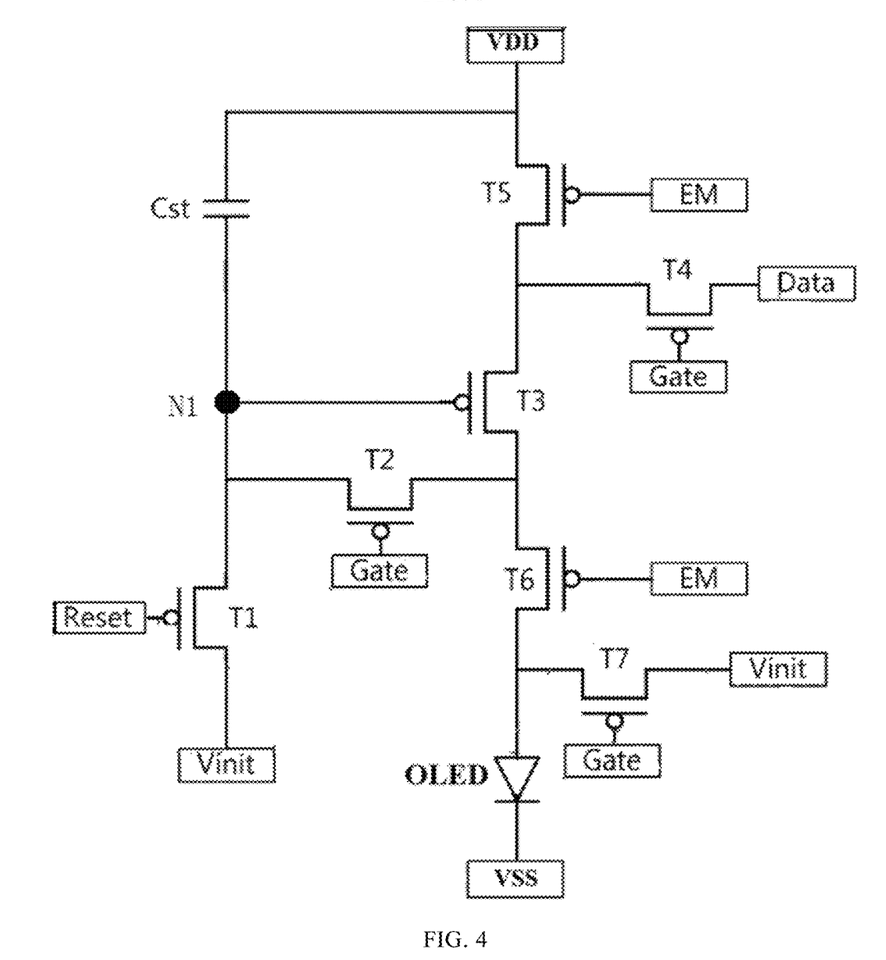
FIG. 4 is a circuit diagram of a pixel circuit in a display panel according to an embodiment of the present disclosure.

Further, for the pixel circuit shown in FIG. 4, when the second transistor T2 and the fourth transistor T4 generate leakage current due to the undesired turning-on, a first node N1 may be erroneously charged, and the voltage is higher, so that the brightness of the corresponding light emitting device OLED is lower.

Moreover, the display substrate may be further divided into four regions, and turning-on signals are respectively provided through control signal terminals EM in the pixel circuits in different regions, so that the time at which the pixel circuits in the four regions are affected by the leakage current is different, and the degrees of the lower brightness of the light emitting devices OLED are also different, which results in the four-split screen phenomenon as shown in FIG. 1.

It should be understood that in the case where the direction of the external electric field is opposite to the original driving electric field, the external electric field "weakens" the driving electric field, and the transistor will not be turned on as desired, and thus the display quality will also be affected.

In a first aspect, referring to FIGS. 2 to 11, an embodiment of the present disclosure provides a display substrate, including: a substrate 91 having a display side and a back side opposite to each other; a display structure provided on the display side of the substrate 91, the display structure including a positive voltage interface for supplying a positive voltage and a plurality of pixel circuits, each pixel circuit including a plurality of transistors; a shielding structure 1 arranged between the substrate 91 and the display structure, the shielding structure 1 being made of a conductive material and electrically coupled to the positive voltage interface, wherein an orthographic projection of active regions 2 of at least some transistors on the substrate 91 coincides with an orthographic projection of the shielding structure 1 on the substrate 91; and an insulating isolation layer 93 disposed between the shielding structure 1 and the display structure.

The display substrate of the embodiment of the present disclosure includes the substrate 91 for supporting other structures, and the substrate 91 may be made of glass, polymer, or the like, and includes the display side from which the light is outgoing to display, and the back side opposite to the display side.

Figure 2:
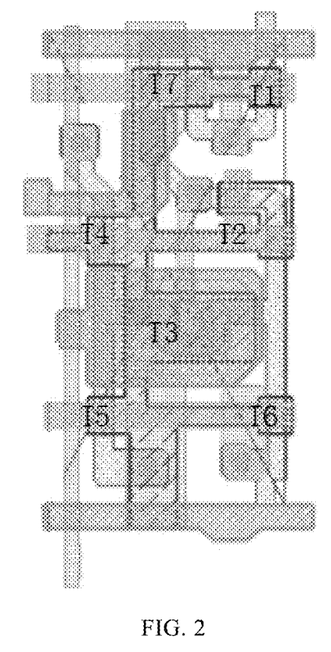
FIG. 2 is a schematic top view of a stacking relationship of partial structures of a pixel circuit in a display substrate according to an embodiment of the present disclosure.
Figure 3:
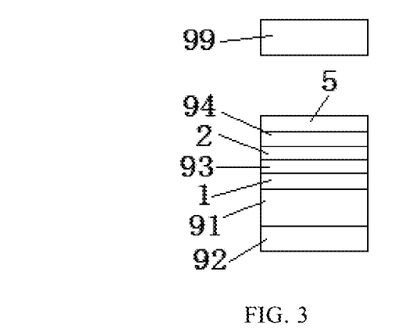
FIG. 3 is a schematic cross-sectional diagram of a stacking relationship of partial structures of an active region in a display panel according to an embodiment of the present disclosure.

Referring to FIGS. 2 and 3, a metal heat dissipation layer 92 (SCF) may be provided (e.g., attached, adhered) on the back side of the display substrate, and the display structure is provided on the display side of the display substrate and includes a plurality of pixel circuits (pixel units), and each pixel circuit includes light emitting devices OLED and a plurality of transistors for driving the light emitting devices OLED to emit light. Of course, each transistor necessarily has an active region 2.

The display substrate of the embodiment of the present disclosure further has the shielding structure 1 (LS) made of a conductive material (e.g., a metal material) and located between the substrate 91 and the active region 2, and the shielding structure 1 is at least located at a position corresponding to the active region 2 of each of some transistors, so as to shield an electric field pointing to the corresponding active region 2.

In order to prevent the shielding structure 1 and the active region 2 from communicating with each other, the insulating isolation layer 93 is further disposed therebetween.

The display substrate further includes the positive voltage interface, which may be in the form of a pad, a pin, or the like, and coupled to a driver IC, or the like, so that the positive voltage (Vdd), i.e., a power voltage applied to a positive electrode of the light emitting device OLED for driving the light emitting device OLED to emit light, may be obtained during a display process.

The shielding structure 1 is also electrically coupled to the positive voltage interface (directly or indirectly), so that the shielding structure 1 also has the positive voltage when display is implemented.

The display substrate may further include the metal heat dissipation layer 92, that is, the metal heat dissipation layer 92 may be directly disposed (e.g., attached, adhered) on the back side of the substrate 91.

When the display substrate is driven, the shielding structure 1 naturally obtains the positive voltage, so the specific timing for driving the display substrate may be the same as that without the shielding structure.

In the embodiment of the present disclosure, the shielding structure 1 is disposed between the active region 2 of the transistor and the back side of the substrate 91 (i.e., the metal heat dissipation layer 92), and thus may shield the external electric field ($E_{external}$) pointed from the metal heat dissipation layer 92 to the cover glass 99; furthermore, the shielding structure 1 is electrically coupled to the positive voltage interface, so the voltage of the shielding structure 1 stabilizes at the positive voltage (Vdd) during display, and the positive voltage is originally present at many positions of the pixel circuit, and thus does not affect the characteristics of the transistor. Therefore, according to the embodiment of the present disclosure, by disposing the shielding structure 1, the influence of the external electric field on the transistor is eliminated, the display defects (such as the four-split screen phenomenon) are avoided, and the display quality may be improved.

In some embodiments, each pixel circuit includes: a storage capacitor Cst having a first electrode coupled to the positive voltage signal terminal VDD, which in turn is electrically coupled to the positive voltage interface; a first transistor T1 having a gate electrode 5 coupled to the reset signal terminal Reset, a first electrode coupled to a second electrode of the storage capacitor Cst, and a second electrode coupled to the initialization signal terminal Vinit; a second transistor T2 having a gate electrode 5 coupled to the gate signal terminal Gate and a first electrode coupled to the second electrode of the storage capacitor Cst; a third transistor T3 having a gate electrode 5 coupled to the second electrode of the storage capacitor Cst and a second electrode coupled to a second electrode of the second transistor T2; a fourth transistor T4 having a gate electrode 5 coupled to the gate signal terminal Gate, a first electrode coupled to a first electrode of the third transistor T3, and a second electrode coupled to the data signal terminal Data; a fifth transistor T5 having a gate electrode 5 coupled to the control signal terminal EM, a first electrode coupled to the positive voltage signal terminal VDD, and a second electrode coupled to the first electrode of the third transistor T3; a sixth transistor T6 having a gate electrode 5 coupled to the control signal terminal EM and a first electrode coupled to the second electrode of the second transistor T2; a seventh transistor T7 having a gate electrode 5 coupled to the gate signal terminal Gate, a first electrode coupled to a second electrode of the sixth transistor T6, and a second electrode coupled to the initialization signal terminal Vinit; and a light emitting device OLED having a first electrode coupled to the second electrode of the sixth transistor T6, and a second electrode coupled to the negative voltage signal terminal VSS.

As a form of the embodiment of the present disclosure, the pixel circuit may be the 7T1C structure as shown in FIG. 4. The light emitting device OLED may be an organic light emitting diode (OLED), and a positive electrode (first electrode) of the light emitting device OLED is electrically coupled to the positive voltage interface through the positive voltage signal terminal VDD to obtain the positive voltage (Vdd), and a negative electrode (second electrode) of the light emitting device OLED is coupled to the negative voltage signal terminal VSS to obtain a negative voltage (Vss).

Figure 5:
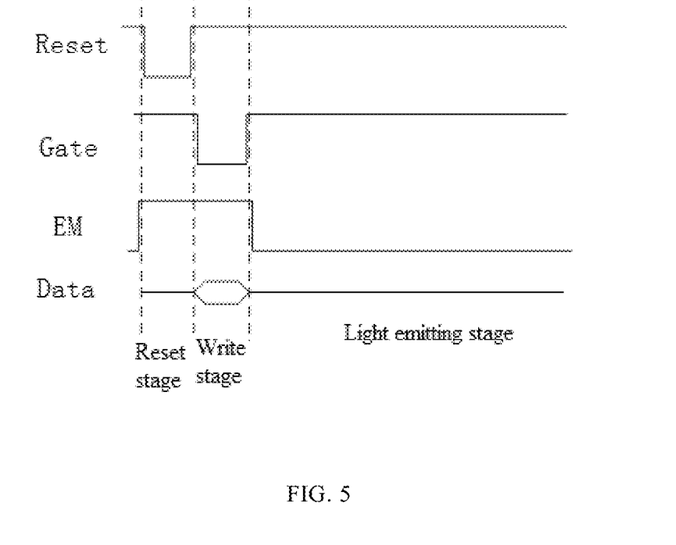
FIG. 5 is a timing diagram for driving the pixel circuit of FIG. 4.

The timing sequence of driving the pixel circuit may be divided into a reset stage, a write stage and a light emitting stage in each period (each frame), voltages of some signal terminals in each stage are shown in FIG. 5 (a high voltage is a turning-on signal, and a low voltage is a turning-off signal), the positive voltage signal terminal VDD and the negative voltage signal terminal VSS may respectively and continuously provide a positive voltage and a negative voltage, and the initialization signal terminal Vinit continuously provides an initialization voltage.

The specific structure and driving timing of the pixel circuit applicable in the embodiments of the present disclosure are various, and are not limited to the above forms, which are not described in detail herein.

In some embodiments, each of orthographic projections of at least the active region 2 of the second transistor T2 and the active region 2 of the fourth transistor T4 on the substrate 91 coincides with an orthographic projection of the shielding structure 1 on the substrate 91.

When the pixel circuit with the above 7T1C structure is adopted, the third transistor T3 is a driving transistor, a voltage of the gate electrode 5 of the third transistor T3 is most likely to affect the display, and in this case, the gate electrode 5 of the third transistor T3 is coupled to the first node N1, and a signal at the first node N1 is likely to be affected by the leakage currents of the second transistor T2 and the fourth transistor T4, so that at least the active regions 2 of the second transistor T2 and the fourth transistor T4 necessarily correspond to the shielding structure 1.

In some embodiments, an orthographic projection of the active region 2 of each transistor on the substrate 91 coincides with the orthographic projection of the shielding structure 1 on the substrate 91.

As an implementation of the embodiment of the present disclosure, referring to FIG. 2, the active regions 2 of all transistors in all pixel circuits (e.g., all 7 transistors in the pixel circuit of the 7T1C structure) may correspond to the shielding structure 1, thereby achieving the best shielding effect.

It is also possible that transistors in only some pixel circuits or only some transistors in each pixel circuit correspond to the shielding structure 1.

In some embodiments, the shielding structure 1 includes a plurality of connection portions and a plurality of shielding portions 11.

Each shielding portion 11 corresponds to the active region 2 of one transistor, and an orthographic projection of the active region 2 of the transistor on the substrate 91 coincides with an orthographic projection of the corresponding shielding portion 11 on the substrate 91.

Each of the shield portions 11 is electrically coupled to the positive voltage interface through the connection portion.

Figure 6:
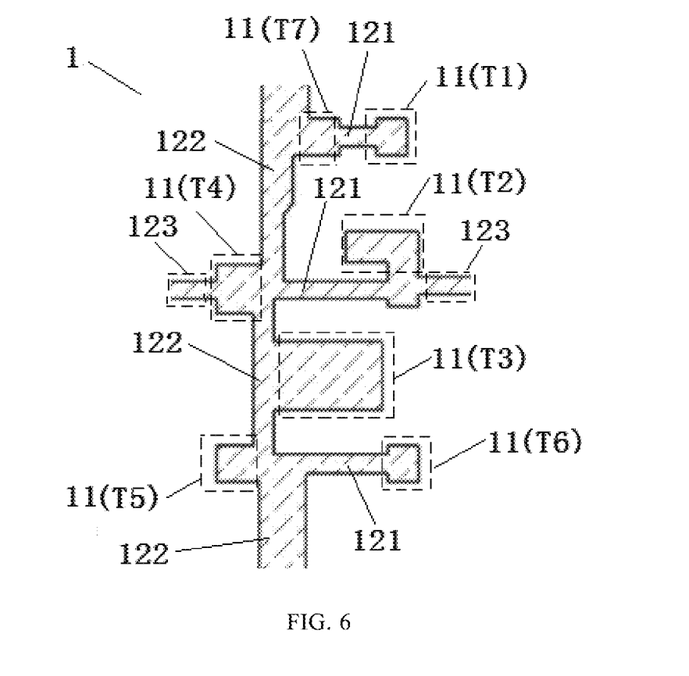
FIG. 6 is a schematic structural top view of a shielding structure of a pixel circuit in a display substrate according to an embodiment of the present disclosure.
Figure 7:
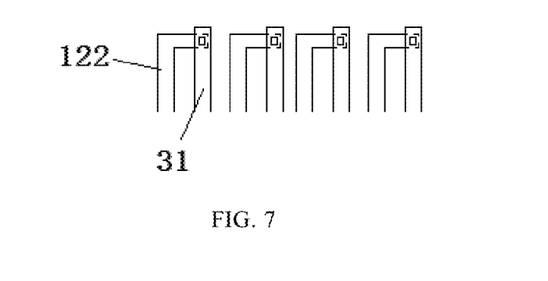
FIG. 7 is a schematic diagram illustrating a connection between a second connection portion and a positive voltage signal line in a display substrate according to an embodiment of the present disclosure.

As an implementation of the embodiment of the present disclosure, the shielding structure 1 may not be a complete layer. Referring to FIG. 6, the shielding structure 1 includes a plurality of shielding portions 11 (i.e., portions actually playing a shielding role) corresponding to the active regions 2 of the transistors, and the shielding portions 11 are discontinuous. In order that each shielding portion 11 obtains a positive voltage (Vdd), a plurality of connection portions are necessarily provided to electrically couple the shielding portions 11 to the positive voltage interface (i.e., the shielding portions 11 are necessarily coupled to the positive voltage interface at least through the connection portions). Thus, the shielding structure 1 in the above form is not one complete layer, but has a number of "missing parts".

In some embodiments, the display structure further includes: a plurality of positive voltage signal lines 31 extending in a first direction, each positive voltage signal line 31 is coupled to a plurality of pixel circuits arranged in a line in the first direction and is electrically coupled to the positive voltage interface.

Each of the shield portions 11 is electrically coupled to the positive voltage signal line 31 through a connection portion.

Figure 11:
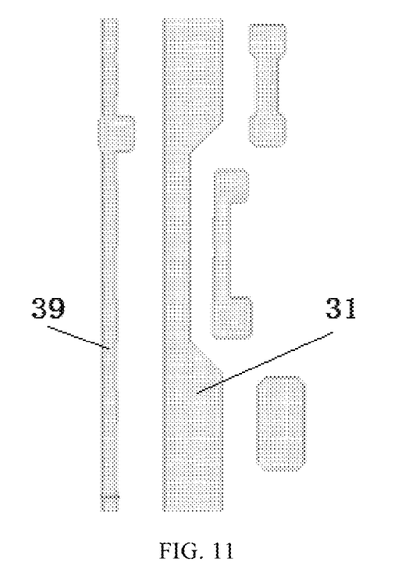
FIG. 11 is a schematic structural top view of a source-drain layer of a pixel circuit in a display substrate according to an embodiment of the present disclosure.

Each pixel circuit of the display substrate necessarily uses the positive voltage, but the positive voltage interface may obviously be located only at a specific position of the display substrate (for example, at one end of the display substrate). Therefore, as shown in FIG. 11, the positive voltage signal line 31 extending along the first direction (in FIG. 11, the up-down direction) is provided, the positive voltage signal line 31 is coupled to the plurality of pixel circuits (for example, coupled to the positive voltage signal terminal VDD of each pixel circuit) arranged in a line (for example, in a column) along the first direction, and is electrically coupled to the positive voltage interface, so that the positive voltage may be introduced into each pixel circuit.

In the case where the positive voltage signal line 31 is provided, each shielding portion 11 may be coupled to the positive voltage signal line 31 through the connection portion, so that the shielding structure is electrically coupled to the positive voltage interface.

In some embodiments, as one implementation of the embodiment of the present disclosure, the connection portion includes a plurality of first connection portions 121, a plurality of second connection portions 122 extending in the first direction.

The plurality of shield portions 11 corresponding to transistors in the plurality of pixel circuits arranged in a line in the first direction are coupled to the same second connection portion 122 through first connection portions 121, respectively.

At one end of the display substrate in the first direction, each of the second connection portions 122 is coupled to one positive voltage signal line 31 through a via in the isolation layer 93.

As one implementation of the embodiment of the present disclosure, referring to FIG. 6, the shielding structure 1 has a plurality of second connection portions 122 extending along the first direction (in FIG. 6, the up-down direction), and each of the shielding portions 11 corresponding to the transistors of the plurality of pixel circuits in the same column is coupled to one second connection portion 122 through the respective first connection portions 121. Further, referring to FIG. 7, each of the second connection portions 122 is coupled to one of the positive voltage signal lines 31 (e.g., the positive voltage signal line 31 corresponding to the same column of pixels) through a via in the isolation layer 93 at one end (the upper end or the lower end) of the display substrate in the first direction, so as to obtain the positive voltage through the positive voltage signal line 31 and introduce the positive voltage into the shielding portions 11.

The connection portion required by the structure is simple in form and is easily manufactured.

In some embodiments, the connection portion further includes third connection portions 123.

In the adjacent pixel circuits at least partially in a direction perpendicular to the first direction, at least some shield portions 11 corresponding to the transistors located in different pixel circuits are coupled to each other through the third connection portions 123.

According to the above configuration, each second connection portion 122 and the first connection portion 121 and the shield portion 11 corresponding thereto actually obtain the positive voltage from only one end of the second connection portion 122. Thus, in order to reduce the transmission resistance, referring to FIG. 6, the shield portions 11 corresponding to the adjacent pixel circuits in the direction (the left-right direction in FIG. 6) perpendicular to the first direction may be coupled to each other by the third connection portions 123, so that a "lateral connection" formed in the shield structure 1, and even the shield structure 1 is formed as a "grid-like" structure.

In some embodiments, as one implementation of the embodiment of the present disclosure, the connection portion includes a fourth connection portion.

The shield portions 11 corresponding to the plurality of transistors of each pixel circuit are coupled to the fourth connection portion, which is coupled to the positive voltage signal line 31 in the pixel circuit through a via in the isolation layer 93.

As another implementation of the embodiment of the present disclosure, the positive voltage signal line 31 may be directly coupled to the shielding portions 11 corresponding to the transistors of each pixel circuit through the fourth connection portion at a position where the pixel circuit is located. Specifically, each shielding portion 11 may be directly coupled to the positive voltage signal line 31 through one fourth connection portion, or the shielding portions 11 corresponding to one pixel circuit may be coupled to each other through a fifth connection portion to have a one-piece structure, which is in turn coupled to the positive voltage signal line 31.

In this way, it may ensure that each of the shield portions 11 may be coupled to the "nearby" positive voltage signal line 31 to reduce the transmission resistance.

It should be understood that it is also possible that the shielding structure 1 is electrically coupled to the positive voltage interface by other means.

For example, the shielding structure 1 may be coupled to other structures having the positive voltage. For example, the shielding structure 1 is coupled to the first electrode of the storage capacitor Cst.

As another example, some structures of the pixel circuit (such as the positive voltage signal line 31) having the positive voltage may extend to the shielding portions 11, and may be directly coupled to the shielding portions 11 through a via in the isolation layer 93 (it may also be understood that the connection portion is not a part of the shielding structure, but belongs to the display structure or the pixel circuit).

In some embodiments, the display structure further includes: a gate insulating layer 94 provided on a side of the active region 2 of each transistor away from the substrate 91; and a first gate layer provided on a side of the gate insulating layer 94 away from the substrate 91, wherein the gate electrode 5 of the transistor is located in the first gate layer.

The gate electrode 5 of each transistor of the pixel circuit may be located on a side of the active region 2 away from the substrate 91. That is, each transistor may be a top-gate transistor.

In some embodiments, the transistor is a P-type transistor.

The transistor may be a P-type transistor, i.e. the active region 2 of the transistor is made of a P-type semiconductor, such as polysilicon (p-Si).

In a case where the transistor is a top-gate P-type transistor, a direction of the driving electric field ($E_{internal}$) is the same as that of the external electric field ($E_{external}$) pointed from the metal heat dissipation layer 92 to the cover glass 99, so that the display defect is more easily generated, and the transistor is more suitable for the embodiment of the present disclosure.

It should be understood that the shielding structure 1 of the embodiment of the present disclosure may also be applied to other types of transistors, such as bottom-gate transistors, N-type transistors, or the like.

In some embodiments, the display structure further includes: a first interlayer insulating layer on a side of the first gate layer away from the substrate 91; a second gate layer on a side of the first interlayer insulating layer away from the substrate 91; a second interlayer insulating layer on a side of the second gate layer away from the substrate 91; a source-drain layer on a side of the second interlayer insulating layer away from the substrate 91; a planarization layer on a side of the source-drain layer away from the substrate 91; and a light emitting device OLED on a side of the planarization layer away from the substrate 91.

The display substrate may further include a structure having the above various layers.

For example, a portion of a structure of the display substrate will be described below.

For example, the following layers may be provided in sequence on the display side of the substrate 91 in a direction away from the substrate 91.

(1) A shielding structure 1 (LS).
The shield structure 1 is made of a conductive material such as metal.
Referring to FIG. 6, the shielding structure 1 may include the connection portions (e.g., the first connection portions 121, the second connection portions 122, and the third connection portions 123) and the shielding portions 11.

(2) An isolation layer 93.
The isolation layer 93 is made of an insulating material such as silicon nitride, silicon oxide, or silicon oxynitride.
A via may be formed in the isolation layer 93 for electrically coupling the shielding structure 1 to the positive voltage interface (e.g., to the positive voltage signal line 31) through the via.

Figure 8:
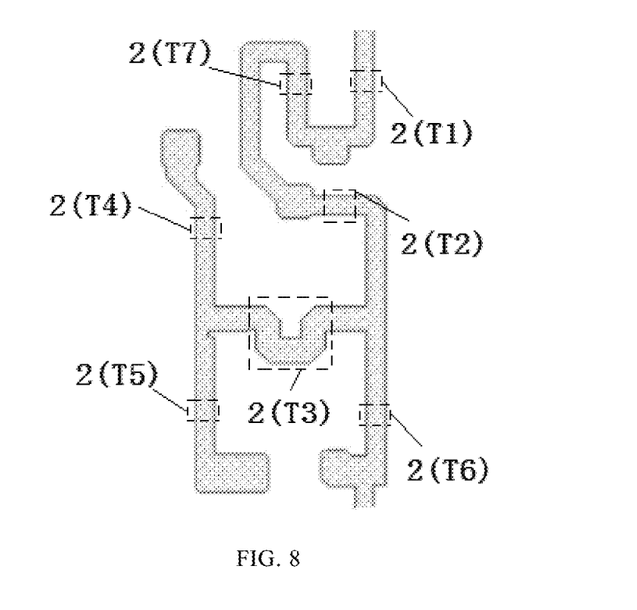
FIG. 8 is a schematic structural top view of a semiconductor layer of a pixel circuit in a display substrate according to an embodiment of the present disclosure.

(3) A semiconductor layer (POLY).
The semiconductor layer is made of a semiconductor material such as polysilicon.
Referring to FIG. 8, the active region 2 of each transistor is provided in the semiconductor layer, and a part of the semiconductor material in the semiconductor layer may be conductive to constitute part of an electrode of the transistor, a connection line, or the like.

(4) A gate insulating layer 94 (GI).
The gate insulating layer 94 is made of an insulating material such as silicon nitride, silicon oxide, or silicon oxynitride. The gate insulating layer 94 is used to separate the active region 2 and the gate electrode 5 of the transistor, and a via may be formed in the gate insulating layer 94 for electrically coupling the shielding structure 1 to the positive voltage interface (e.g., to the positive voltage signal line 31) through the via.

Figure 9:
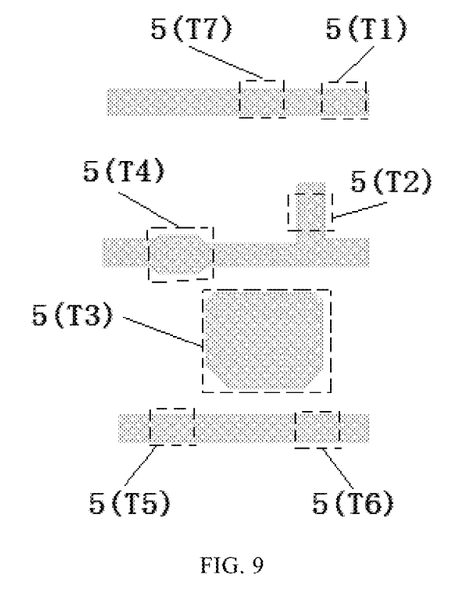
FIG. 9 is a schematic structural top view of a first gate layer of a pixel circuit in a display substrate according to an embodiment of the present disclosure.

(5) A first gate layer (GATE1).
The first gate layer is made of a conductive material such as a metal.
Referring to FIG. 9, the gate electrode 5 of each transistor is disposed in the first gate layer, and each signal terminal (e.g., the gate signal terminal Gate, the control signal terminal EM, the reset signal terminal Reset) coupled to the gate electrode 5 and a corresponding signal line (e.g., the gate signal line, the control signal line, the reset signal line) may also be disposed in the first gate layer.
Each signal terminal may be a structure extending from the corresponding signal line, or may be a part of the corresponding signal line.
In addition, the second electrode of the storage capacitor Cst is coupled to the gate electrode 5 of the third transistor T3, and thus may also be located in the first gate layer (i.e., the second electrode of the storage capacitor Cst and the gate electrode 5 of the third transistor T3 may have a one-piece structure).

(6) A first interlayer insulating layer (ILD1).
The first interlayer insulating layer is made of an insulating material such as silicon nitride, silicon oxide, or silicon oxynitride.
A via may be formed in the first interlayer insulating layer for electrically coupling the shielding structure 1 to the positive voltage interface (e.g., to the positive voltage signal line 31) through the via.

Figure 10:
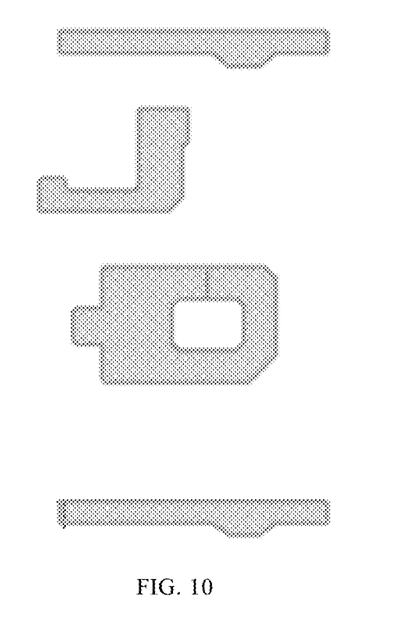
FIG. 10 is a schematic structural top view of a second gate layer of a pixel circuit in a display substrate according to an embodiment of the present disclosure.

(7) A second gate layer (GATE2).
The second gate layer is made of a conductive material such as a metal.
Referring to FIG. 10, some signal terminals (e.g., the initialization signal terminal Vinit) and a corresponding signal line (e.g., the initialization signal line), the first electrode of the storage capacitor Cst, etc. may be disposed in the second gate layer.

(8) A second interlayer insulating layer (ILD2).
The second interlayer insulating layer is made of an insulating material such as silicon nitride, silicon oxide, or silicon oxynitride.
A via may be formed in the second interlayer insulating layer for electrically coupling the shielding structure 1 to the positive voltage interface (e.g., to the positive voltage signal line 31) through the via.

(9) A source-drain layer (SD1).
The source-drain layer is made of a conductive material, such as metal.
Referring to FIG. 11, the positive voltage signal lines 31, and the positive voltage signal terminal VDD may be disposed in the source-drain layer, and some signal terminals (e.g., the data signal terminal Data) and the corresponding signal line (e.g., the data signal line 39) may also be disposed in the source-drain layer.
In addition, some connection lines used for coupling different structures may also be provided in the source-drain layer.

(10) A planarization layer (PLN).
The planarization layer is made of an organic insulating material.
The planarization layer serves to eliminate a segment gap of the underlying structure, a via may be provided in the planarization layer for coupling the first electrode of the light emitting device OLED to a transistor (e.g., the second electrode of the sixth transistor T6) through the via.

(11) A first electrode of the light emitting device OLED. Specifically, the first electrode of the light emitting device OLED may be a positive electrode (anode) of an organic light emitting diode, and may be made of a metal oxide conductive material such as indium tin oxide (ITO), and is coupled to the transistor (e.g., the second electrode of the sixth transistor T6) through the via in the planarization layer.

(12) A pixel definition layer (PDL).

The pixel definition layer is made of an organic insulating material.

The pixel definition layer is used to define a range of the light emitting device OLED through an opening therein.

(13) A light emitting layer of the light emitting device OLED.

The light emitting layer is a layer used for actually emitting light in the light emitting device OLED, and may be a light emitting layer of an organic light emitting diode, and the light emitting layer of the organic light emitting diode is made of an organic material and includes at least an organic light emitting layer (EML), and may further include other auxiliary layers such as an electron injection layer (EIL), an electron transport layer (ETL), a hole injection layer (HIL), and a hole transport layer (HTL), which are stacked.

The light emitting layer of the organic light emitting diode may be a whole layer, and contacts the anode of the organic light emitting diode at the opening of the pixel definition layer, so that the organic light emitting diode is formed.

(14) A second electrode of the light emitting device OLED.

Specifically, the second electrode of the light emitting device OLED may be a negative electrode (cathode) of the organic light emitting diode, which may be made of a metal conductive material such as aluminum.

The cathode of the organic light emitting diode may be a whole layer, and thus is also the negative voltage signal terminal VSS.

(15) An encapsulation layer.

The encapsulation layer may be a structure of organic layers and inorganic layers, which are alternately stacked together, and be used for encapsulating other structures therein and preventing the other structures (especially the light emitting layer) from being aged due to in contact with water and oxygen in the environment.

The complete film layer in each layer may be formed through a solution process, a deposition process and the like: the layer having a specific shape may be formed through a patterning process.

It will be appreciated that the structure of the specific layers of the display substrate are merely illustrative and that many variations are possible.

In a second aspect, referring to FIG. 3, an embodiment of the present disclosure provides a display panel, including: the display substrate in any one of the above embodiments; a cover glass 99 located outside the display side of the substrate 91 of the display substrate; and a metal heat dissipation layer 92 on the back side of the substrate 91 of the display substrate.

The display panel having a display function may be formed by assembling the display substrate, the cover glass 99 (CG) and the metal heat dissipation layer 92 (SCF).

Referring to FIG. 3, the cover glass 99 is located on the display side of the display substrate and may be coupled to the display substrate by a sealant or the like: the metal heat dissipation layer 92 is disposed on the back side of the display substrate, and may be coupled to the display substrate by attachment (adhesion).

Therefore, the direction of the external electric field ($E_{external}$) generated by the display panel due to friction and the like points to the cover glass 99 from the metal heat dissipation layer 92, and the shielding structure 1 is located between the metal heat dissipation layer 92 and the active region 2 of the transistor, so that the influence of the external electric field on the active region 2 may be effectively shielded, the display quality of the display panel is improved, and the defects such as the four-split screen phenomenon and the like are avoided.

The display panel may further include other structures such as a driving chip, a circuit board, a power supply, a housing, and a bracket, which are not described in detail herein.

Specifically, the display panel may be any product or component having a display function, such as an organic light emitting diode (OLED) display panel, an electronic paper, a mobile phone, a tablet computer, a television, a display, a notebook computer, a digital photo frame or a navigator or the like.

In a third aspect, an embodiment of the present disclosure provides a method for manufacturing a display substrate, the display substrate is the display substrate in any one of the above embodiments, and the method includes: sequentially forming a shielding structure, an isolation layer and a display structure on the display side of the substrate.

Obviously, on the same side of the substrate, a structure farther from the substrate has to be formed "more later", so when the display substrate is to be manufactured, the shielding structure, the isolation layer, the display structure, and the like need to be successively formed on the display side of the substrate.

The shielding structure, the isolation layer, and the display structure may be formed through a patterning process, and the display structure may include the multiple layers, and each layer may also be formed through different patterning processes, and the details are not described herein.

If necessary, the metal heat dissipation layer may be formed on the back side of the substrate by attachment (adhesion) or the like, which will not be described in detail herein.

The present disclosure has disclosed example embodiments, and although specific terms are employed, they are used and should be interpreted in a generic and descriptive sense only and not for purposes of limitation. In some instances, features, characteristics and/or elements described in connection with a particular embodiment may be used alone or in combination with features, characteristics and/or elements described in connection with other embodiments, unless expressly stated otherwise, as would be apparent to one skilled in the art. It will, therefore, be understood by one of ordinary skill in the art that various changes in form and details may be made therein without departing from the scope of the present disclosure as set forth in the appended claims.

What is claimed is:

1. A display substrate, comprising:
    a substrate having a display side and a back side opposite to each other;
    a display structure on the display side of the substrate, the display structure comprising a positive voltage interface configured to supply a positive voltage and a plurality of pixel circuits, each pixel circuit comprising a plurality of transistors;

a shielding structure between the substrate and the display structure, the shielding structure being made of a conductive material and electrically coupled to the positive voltage interface; and an insulating isolation layer between the shielding structure and the display structure, wherein each pixel circuit comprises:

a storage capacitor having a first electrode coupled to a positive voltage signal terminal, which is electrically coupled to the positive voltage interface;

a first transistor having a gate electrode coupled to a reset signal terminal, a first electrode coupled to a second electrode of the storage capacitor, and a second electrode coupled to an initialization signal terminal;

a second transistor having a gate electrode coupled to a gate signal terminal and a first electrode coupled to the second electrode of the storage capacitor;

a third transistor having a gate electrode coupled to the second electrode of the storage capacitor and a second electrode coupled to a second electrode of the second transistor;

a fourth transistor having a gate electrode coupled to the gate signal terminal, a first electrode coupled to a first electrode of the third transistor, and a second electrode coupled to a data signal terminal;

a fifth transistor having a gate electrode coupled to a control signal terminal, a first electrode coupled to the positive voltage signal terminal, and a second electrode coupled to a first electrode of the third transistor;

a sixth transistor having a gate electrode coupled to the control signal terminal and a first electrode coupled to the second electrode of the second transistor;

a seventh transistor having a gate electrode coupled to the gate signal terminal, a first electrode coupled to a second electrode of the sixth transistor, and a second electrode coupled to the initialization signal terminal; and a light emitting device having a first electrode coupled to the second electrode of the sixth transistor, and a second electrode coupled to a negative voltage signal terminal, wherein orthographic projections of active regions of only the second transistor and the fourth transistor on the substrate coincide with the orthographic projection of the shielding structure on the substrate.

2. The display substrate of claim 1, wherein the shielding structure comprises a plurality of connection portions, and a plurality of shielding portions;

each shielding portion corresponds to an active region of a respective one of the second transistor and the fourth transistor, and the orthographic projection of the active region of each of the second transistor and the fourth transistor on the substrate coincides with the orthographic projection of shielding portion corresponding thereto on the substrate; and each shield portion is electrically coupled to the positive voltage interface through the connection portion.

3. The display substrate of claim 2, wherein the display structure further comprises:

a plurality of positive voltage signal lines extending in a first direction, each positive voltage signal line coupling a plurality of pixel circuits arranged in a line in the first direction and being electrically coupled to the positive voltage interface; and each shield portion is electrically coupled to the positive voltage signal line through the connection portion.

4. The display substrate of claim 3, wherein the plurality of connection portions comprise a plurality of first connection portions, and a plurality of second connection portions extending in the first direction;

the shield portions corresponding to the transistors in the plurality of pixel circuits arranged in a line in the first direction are coupled to a same second connection portion through the first connection portions, respectively; and at one end of the display substrate in the first direction, each of the second connection portions is coupled to a respective one of the plurality of positive voltage signal lines through a via in the insulating isolation layer.

5. The display substrate of claim 4, wherein the connection portion further comprises a of third connection portion; and in at least a portion of adjacent pixel circuits arranged in a direction perpendicular to the first direction, at least some shield portions corresponding to the transistors in different pixel circuits are coupled to each other through the third connection portion.

6. The display substrate of claim 3, wherein the connection portion further comprises a fourth connection portion; and the shield portions corresponding to the second transistor and the fourth transistor of each pixel circuit are coupled to the fourth connection portion, which is coupled to the positive voltage signal line in the pixel circuit through a via in the insulating isolation layer.

7. The display substrate of claim 1, wherein the display structure further comprises:

a gate insulating layer on a side of the active region of each transistor away from the substrate; and a first gate layer on a side of the gate insulating layer away from the substrate, wherein a gate electrode of the transistor is in the first gate layer.

8. The display substrate of claim 7, wherein the transistor is a P-type transistor.

9. The display substrate of claim 7, wherein the display structure further comprises:

a first interlayer insulating layer on a side of the first gate layer away from the substrate;

a second gate layer on a side of the first interlayer insulating layer away from the substrate;

a second interlayer insulating layer on a side of the second gate layer away from the substrate;

a source-drain layer on a side of the second interlayer insulating layer away from the substrate;

a planarization layer on a side of the source-drain layer away from the substrate; and a light emitting device on a side of the planarization layer away from the substrate.

10. A display panel, comprising:

the display substrate of claim 1;

a cover glass on the display side of the substrate of the display substrate; and a metal heat dissipation layer on the back side of the substrate of the display substrate.

11. A method of manufacturing a display substrate, wherein the display substrate is the display substrate of claim 1, and the method comprises:

sequentially forming the shielding structure, the insulating isolation layer and the display structure on the display side of the substrate.

12. A display panel, comprising:
the display substrate of claim 2;
a cover glass on the display side of the substrate of the display substrate; and
a metal heat dissipation layer on the back side of the substrate of the display substrate.

13. A display panel, comprising:
the display substrate of claim 3;
a cover glass on the display side of the substrate of the display substrate; and
a metal heat dissipation layer on the back side of the substrate of the display substrate.

14. A display panel, comprising:
the display substrate of claim 4;
a cover glass on the display side of the substrate of the display substrate; and
a metal heat dissipation layer on the back side of the substrate of the display substrate.

15. A display panel, comprising:
the display substrate of claim 5;
a cover glass on the display side of the substrate of the display substrate; and
a metal heat dissipation layer on the back side of the substrate of the display substrate.

16. A display panel, comprising:
the display substrate of claim 6;
a cover glass on the display side of the substrate of the display substrate; and
a metal heat dissipation layer on the back side of the substrate of the display substrate.

* * * * *